United States Patent [19]
Karema et al.

[11] Patent Number: 5,248,972
[45] Date of Patent: Sep. 28, 1993

[54] DELTA-SIGMA ANALOG-TO-DIGITAL CONVERTER WITH OVERLOAD DEPENDENT MODULATOR ORDER

[75] Inventors: Teppo Karema; Hannu Tenhunen; Tapani Ritoniemi, all of Tampere, Finland

[73] Assignees: Nokia Matkapuhelimet Oy, Salo; Fincitec Oy, Kemi, both of Finland

[21] Appl. No.: 863,063

[22] Filed: Apr. 3, 1992

[30] Foreign Application Priority Data

Apr. 9, 1991 [FI] Finland .................. 911694

[51] Int. Cl.⁵ .................................................. H03M 3/00
[52] U.S. Cl. .................................................. 341/143
[58] Field of Search .................................................. 341/143

[56] References Cited

U.S. PATENT DOCUMENTS 4,509,037 4/1985 Harris .................. 341/143
5,012,244 4/1991 Welland et al. .................. 341/143

Primary Examiner—Howard L. Williams
Attorney, Agent, or Firm—Watson, Cole, Grindle & Watson

[57] ABSTRACT

The invention relates to a method and an arrangement for stabilizing a high-order sigma-delta modulator comprising at least two integrator stages and a quantizing means. The first, the first two or the first three integrator stages of the high-order modulator form a low-order modulator which is stable at all input signal values. The arrangement comprises a means for resetting the integrator stages following the low-order modulator when the stable operation range of the high-order modulator is exceeded. For an MF modulator the arrangement further comprises a coupling means for decoupling the output of the last integrator of the high-order modulator from the quantizing means and for coupling the output of said low-order modulator to the quantizing means simultaneously with the resetting.

3 Claims, 3 Drawing Sheets

DELTA-SIGMA ANALOG-TO-DIGITAL CONVERTER WITH OVERLOAD DEPENDENT MODULATOR ORDER

FIELD OF THE INVENTION

The invention relates to a method and an arrangement for stabilizing a high-order sigma-delta modulator comprising at least two integrator stages.

BACKGROUND OF THE INVENTION

The need for high-resolution analog-to-digital converters (A/D) has increased the use of a noise shaping technique based on oversampling and sigma-delta modulation. The resolution of a sigma-delta-A/D modulator is determined by the oversampling ratio (M) and the order of the noise shaping function. There are, however, severe stability problems associated with high-order (>2) sigma-delta modulators.

The stability of high-order modulators is dependent on the amplitude of an incoming signal. When the modulator assumes an unstable mode of operation, the voltages of its integrators increase abruptly, and the bit stream from the output of the modulator begins to oscillate independently of the input signal. The high-order modulator does not return to the linear operation range even though the input would return to the stable operation range. In known solutions to the problem, the modulator is maintained stable by resetting all integrators during excessive input signal values or by accurately limiting the voltage range of the integrators within the stable operation range.

The problem with the limiting of the voltage range of the integrators is the technical realization. Above all, it is necessary to avoid any unnecessary circuits in the first stages of the modulators, in which the sensitivity of the modulator is at highest. With a signal-to-noise ratio exceeding 16 bits (98 dB), the required circuits are difficult to effect. The sensitivity of the modulator to interferences decreases rapidly in the subsequent integrator stages, and therefore it is advisable to make the additional circuits in these stages.

In addition, the resetting of all integrators in a multiple-feedback (MF) type modulator causes a reduction in the power of the bit stream from the modulator output during input signal levels above the stable operation range. As a result of this, values obtained from a decimalization filter following the modulator are smaller than within the normal operation range. This is very detrimental in practical applications. It is normally desired that the output is saturated to a maximum value when the amplitude of the input signal exceeds its operation range. In a feedforward (FF) type modulator the resetting of the integrator stages can be used without the problems described above.

SUMMARY OF THE INVENTION

The object of the invention is to improve the stability of high-order sigma-delta modulators.

This is achieved by means of a method according to the invention for stabilizing high-order sigma-delta modulators, wherein the order of the high-order modulator is temporarily lowered when the amplitude of a modulator input signal exceeds the stable operation range of the high-order modulator so that the modulator is stable irrespective of the amplitude of the modulator input signal. As the conventional resetting of all integrators for stabilizing the modulators causes interference in the signal in practical applications (in the first integrator stage), the invention aims at avoiding such resetting. As is well-known, a low-order i.e. first-order modulator is stable irrespective of the level of the input signal and so is a second-order sigma-delta modulator. A third-order modulator can be made stable in practical applications by limiting the integrators to a stable operation range by the operating voltages. Modulators of a higher order than that require external stabilization. The basic idea of the invention is that the stability is ensured, and the resetting of the first integrator stage or the first integrator stages is avoided by lowering the order of the high-order modulator so as to convert the modulator temporarily into a first-, second-, or third-order modulator, which is stable irrespective of the level of the input signal, when the level of the input signal exceeds the stable operation range of the high-order modulator, which is detected by monitoring the voltages of the integrator stages. When the level of the input signal is within said stable operation range, the modulator operates in a normal way as a high-order modulator, and so the better quantization noise shaping properties of the high-order modulator are obtained.

The invention also relates to the arrangements disclosed in claims 4 and 5 for stabilizing high-order sigma-delta modulators of the FF and MF types.

BRIEF DESCRIPTION OF THE DRAWINGS

In the following the invention will be described in more detail by means of illustrating embodiments with reference to the attached drawings, in which

FIGS. 5, 6 and 7 are graphic representations of the digital output Dout of the modulators of FIGS. 1, 2 and 4, respectively, as a function of an input signal IN.

DESCRIPTION OF THE PREFERRED EMBODIMENTS OF THE INVENTION

Figure 1:
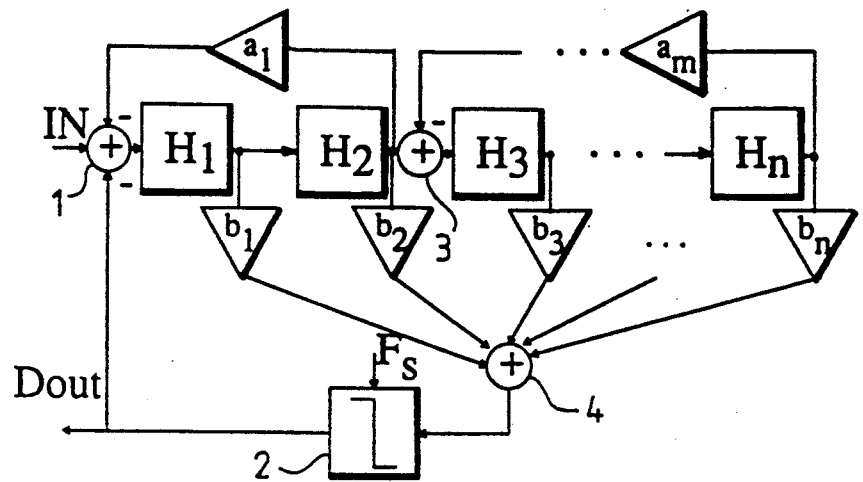
FIGS. 1 AND 2 show block diagrams of prior art sigma-delta modulators realized in a feedforward (FF) configuration and a multiple feedback (MF) configuration, respectively.
Figure 2:
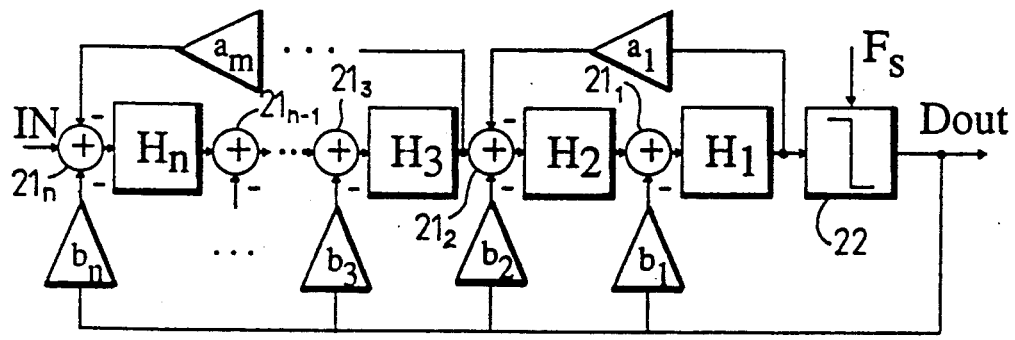

Sigma-delta modulators can be realized by using either a feedforward (FF) configuration, as in FIG. 1, or a multiple feedback (MF) configuration, as in FIG. 2. The sigma-delta modulators in FIG. 1 and FIG. 2 comprise a series connection of n integrator stages H1, H2, ... Hn, where n is a positive integer. The order of the modulator is equal to the number of the integrator stages. A modulator comprising at least two integrator stages (a second-order modulator) is called a high-order modulator. In the following these two well-known modulator structures will be described generally.

In the FF-type modulator shown in FIG. 1, an output signal Dout of a quantizer 2 (and of the entire modulator) and an output voltage of the second integrator H2 scaled by a feedback coefficient a1 are subtracted from an input signal IN of the modulator in a subtractor means 1. The output of the subtractor means 1 is applied to the first integrator stage H1 having an output connected to the second integrator stage H2. An output voltage of the last integrator stage Hn is scaled by a feedback coefficient a2 and then subtracted from the output of the second integrator stage H2 in a subtractor means 3, and the difference is applied to the third integrator stage H3. The output voltage of each integrator stage H1 ... Hn is scaled with a respective weighting coefficient b1 ... bn and applied to a summing means 4 having an output connected to the quantizer or comparator 2. The quantizer 2, the subtractor means 1 and 3, the summing means 4 and the transfer of the integrator voltages from one integrator stage to a subsequent one is controlled by an oversampling clock Fs.

In the MF-type modulator shown in FIG. 2 a digital output signal Dout of a quantizer 22 (and of the entire modulator) is scaled by a feedback coefficient bn and subtracted from an input signal IN of the modulator in a subtractor means $21_n$ and then applied to the first integrator stage Hn. A similar subtractor means $21_{n-1}$ .. . $21_1$ is provided in the input of each subsequent integrator stage $H_{n-1}$ ... $H_1$ for subtracting an output signal Dout scaled by a respective feedback coefficient $b_{n-1}$ .. . $b_1$ from the output signal of a preceding integrator and applying the difference to the input of a subsequent integrator stage. The subtractor means $21_n$ also subtracts the output voltage of the integrator stage $H_3$ scaled by a feedback coefficient $a_m$ from the input signal IN. Correspondingly, the subtractor $21_2$ also subtracts the output voltage of the last integrator stage H1 scaled by a feedback coefficient $a_1$ from the output signal of the integrator stage $H_3$. The quantizer 22 and the subtractor means $21_n$ ... $21_1$ are controlled by the oversampling clock Fs. The feedbacks $a_1$ ... $a_m$ are not necessary in the modulator. The quantization noise can be shaped by these coefficients so that the amount of noise on the pass band decreases as compared with a modulator without such feedback coefficients.

As to the practical applications of modulators, reference is made to the doctoral thesis *High Performance Analog Interfaces for Digital Signal Processors*, Frank OP 'T Eyende, Katholieke Universiteit Leuve'n, Nov. 1990, and the article *Design of stable high order 1-bit sigma-delta modulators*, Tapani Ritoniemi et al., Proceedings of IEEE International Symbosium on Circuits and Systems, May 1990, pp. 3267-3270, which describes the design of third-, fourth-, fifth-, and sixth-order FF and MF modulators when using the Switched capacitor (SC) technique. The article also describes stability problems and solving such problems by limiting the input signal.

As already mentioned above, another prior art technique for stabilizing a sigma-delta modulator is to reset all modulator integrator stages.

Figure 5:
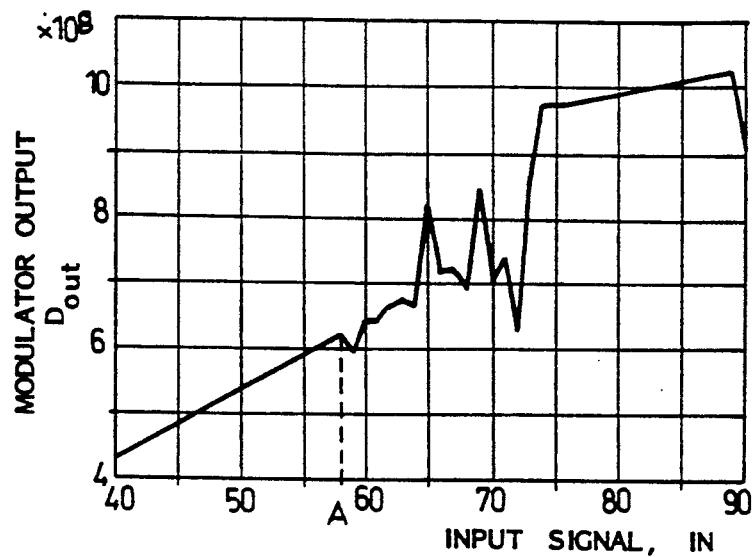
Figure 6:
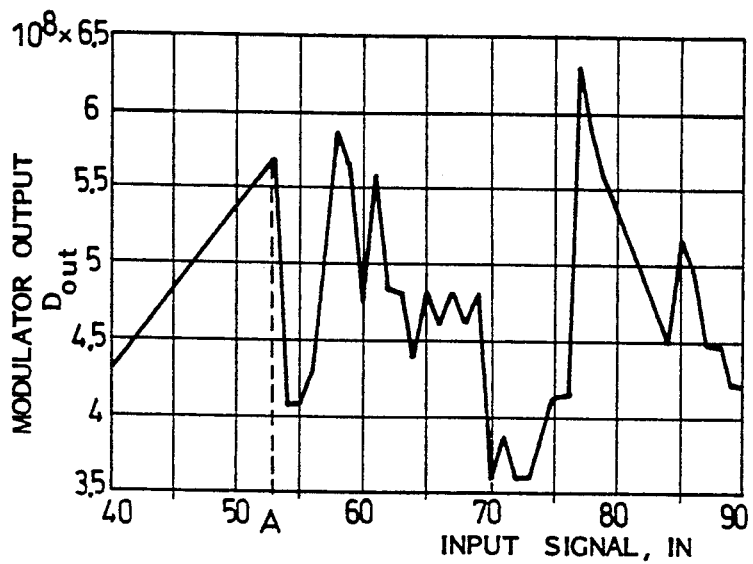

FIGS. 5 and 6 show the digital outputs Dout of the fifth-order modulators of FIGS. 1 and 2 as a function of the input signals IN. The stable linear range of the modulator extends up to a point A. When the input level IN exceeds the point A, all modulator integrator stages are reset to return the modulator from the unstable mode. In FIG. 5 the output Dout of the FF modulator is thereby saturated to a value equal to or greater than its maximum value, which is the desired result. In FIG. 6, the resetting of the integrators of the MF modulator causes a reduction in the power of the outbound bit stream on signal levels above the point A, and so values obtained from the decimalization filter following the modulator are smaller than within the normal stable operation range of the input signal. This phenomenon is very detrimental in practical applications.

The invention aims at improving the stability of a high-order modulator when the amplitude of the input signal exceeds its normal stable operation range by temporarily lowering the order of the high-order modulator so that it is stable irrespective of the amplitude of the input signal of the modulator. In the preferred embodiment of the invention, the output voltage of the first, second or third integrator of the modulator is monitored and the order of the modulator is lowered by resetting all integrators following the integrator which is being monitored when the output voltage of the integrator being monitored exceeds a predetermined threshold value.

In the following this basic idea of the invention will be described by means of two illustrating embodiments.

Figure 3:
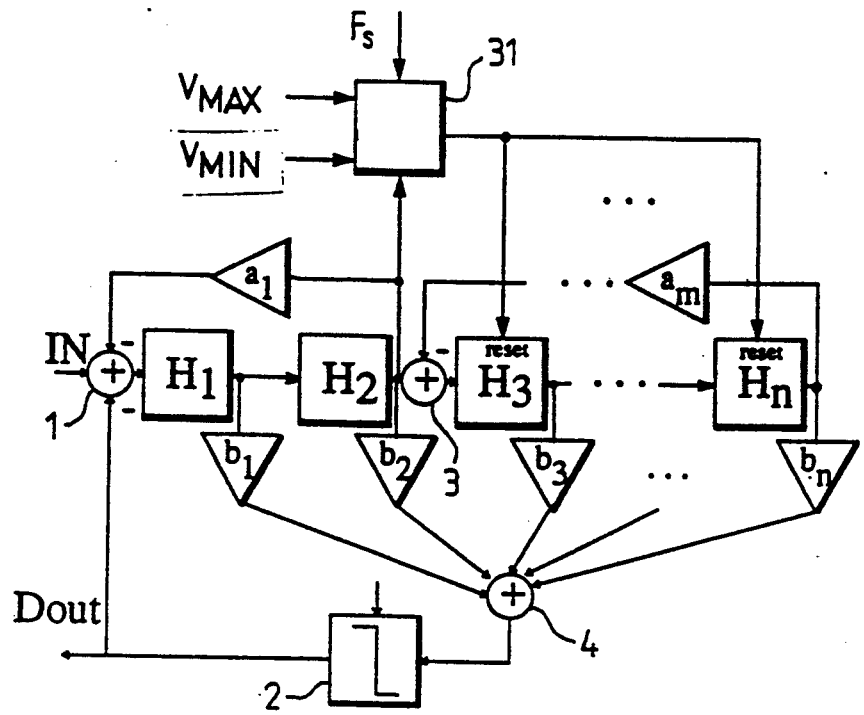
FIG. 3 shows a block diagram of an FF-type sigma-delta modulator, in which the stabilization according to the invention is applied.

The block diagram of FIG. 3 illustrates the realization of the stabilization according to the invention in a sigma-delta modulator of the feedforward (FF) type shown in FIG. 1. The structure of the sigma-delta modulator itself is substantially similar to that of FIG. 1, wherefore only differences relevant to the invention will be described below. The same reference numerals and symbols in FIGS. 1 and 3 indicate the same items or functions.

In the embodiment of FIG. 3, the first two integrator stages of the high-order (n-order) sigmadelta modulator form a second-order sigma-delta modulator which is stable irrespective of the level of the input signal IN. The stabilization circuit comprises a comparator means 31 to one input of which the output voltage of the second integrator stage H2 (i.e. of said second-order modulator) is connected. In addition, two reference voltages Vmax and Vmin representing the highest and lowest value of the stable range of the input voltage IN are connected to the comparator circuit 31. The output of the comparator circuit 31 is connected to resetting inputs RESET in the integrator stages H3 ... Hn following the integrator stage H2 being monitored. When the input signal IN is within said stable linear range, the modulator of FIG. 3 operates in a normal way as an n-order modulator. When the comparator circuit 31 detects that the output voltage of the integrator stage H2 exceeds the reference voltage Vmax, the state of the output of the comparator circuit 31 is changed, as a result of which the integrator stages H3 ... Hn are reset and only the first two integrator stages H1 and H2 remain in operation, thus forming the modulator output Dout through the summing means 4 and the quantizer 2. In this way the n-order modulator of FIG. 3 is temporarily converted into a second-order modulator, which is stable at all values of the input signal. Accordingly, the output signal at the modulator output Dout is stable, though also relatively noisy, even at input signal values outside of the stable operation range of the n-order modulator. The comparator means 31 maintains the integrator stages H3 ... Hn reset until the output voltage of the integrator stage H2 is again smaller than Vmax, that is, the input signal IN has returned to the stable operation range. Above, the output voltage of the integrator stage H2 is monitored. Alternatively, it is also possible that only the first integrator stage H2 is made stable and its output voltage is monitored, or a modulator comprising the first, second and third integrator stages H1, H2 and H3 is made stable at all values of the input signal IN and the output voltage of the integrator stage H3 is monitored. Also in this case, all integrator stages following the integrator stage being monitored are reset.

Figure 4:
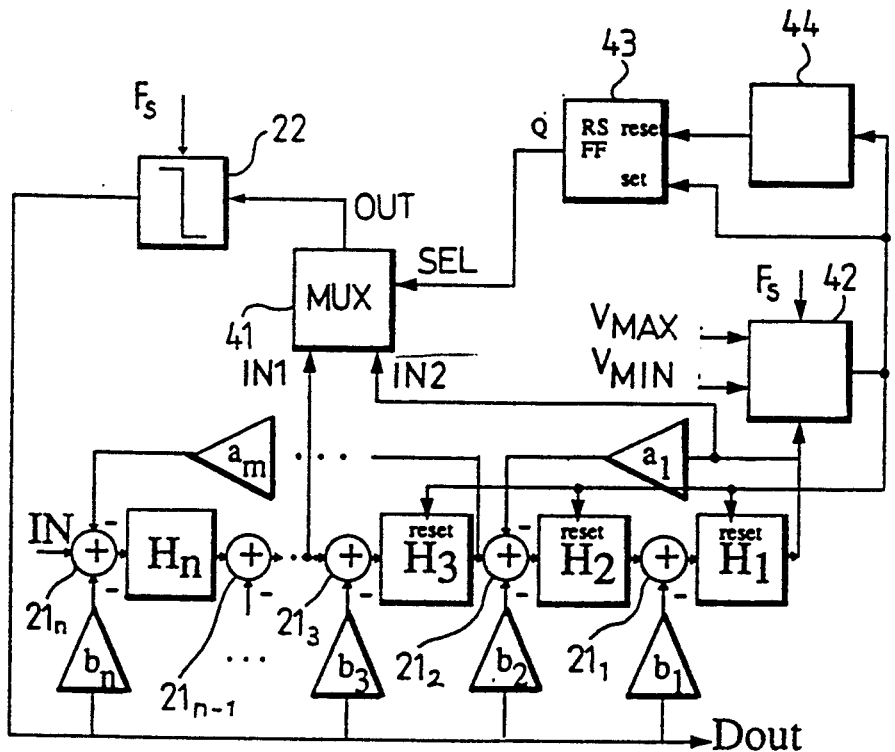
FIG. 4 shows a block diagram of an FF-type sigma-delta modulator, in which the stabilization according to the invention is applied.

FIG. 3 shows another embodiment of the invention, in which the stabilization according to the invention is applied in a sigma-delta modulator of the multiple feedback (MF) type shown in FIG. 2. The modulator arrangement itself is substantially similar to that shown in FIG. 2, and only differences relevant to the invention will be described below. The same reference numerals in FIGS. 2 and 4 indicate the same items or functions. In the embodiment of FIG. 4, the first, the first two, or the first three integrator stages Hn, Hn-1 and HN-2 form a first-, second-, or third-order sigma-delta modulator, respectively, which is stable irrespective of the amplitude of the input signal IN. The output of this first-, second-, or third-order modulator is connected to a first input IN1 in a selector means or an analog multiplexer 41. The output of the last integrator stage H1 in the n-order modulator is connected to a second input IN2 in the multiplexer 41. The output of the multiplexer 41 is connected to the quantizer 22. The multiplexer 41 couples either one of its inputs IN1 and IN2 to the quantizer 22, depending on the state of a selection signal SEL. The output voltage of the last integrator H1 of the n-order modulator is connected to one input in a comparator circuit 42. Reference voltages Vmax and Vmin representing the upper and lower limits of the stable range of the input signal IN and an oversampling clock signal Fs synchronizing the comparator circuit with the operation of the rest of the modulator are also connected to the comparator circuit 42. The output of the comparator circuit 42 is connected to the resetting input RESET of the integrator stages H3, H2 and H1 following said low-order modulator, to a setting input SET of an RS flip-flop and to the input of a delay means 44. The output of the delay means 44 is connected to a resetting input RESET of the RS flip-flop 43. A non-inverted output Q of the RS flip-flop 43 generates the selection signal SEL for the multiplexer 41. When the input signal IN is within its stable operation range, the connection of FIG. 4 operates as an n-order modulator, and so the multiplexer 41 couples the input IN2 to the quantizer 22. When the comparator means 42 detects that the output voltage of the integrator stage H1 exceeds the reference voltage Vmax, the state of the output of the comparator means 42 is changed so that the integrator stages H3, H2 and H1 are reset and the state of the output of the RS flip-flop 43 is changed. As a result, the multiplexer 41 couples the input IN1 to the quantizer 22. According to the invention, the modulator of FIG. 4 thereby acts as a first-, second-, or third-order modulator, which is stable irrespective of the level of the input signal IN. This is continued until the output voltage of the integrator stage H1 is again smaller than the reference voltage Vmax. The state of the comparator means 42 is then changed so that the integrator stages H3, H2 and H1 are released. The multiplexer 41, however, maintains the input IN connected to the quantizer 22 during the delay of the delay means 44, which is at least equal to the delay of the integrator stages H3, H2 and H1 following the low-order modulator (at least one clock cycle per each delaying integrator stage). Delaying is required in order that the signal would have time to propagate to the last integrator H1 before its output is again selected as the input of the quantizer 22.

Figure 7:
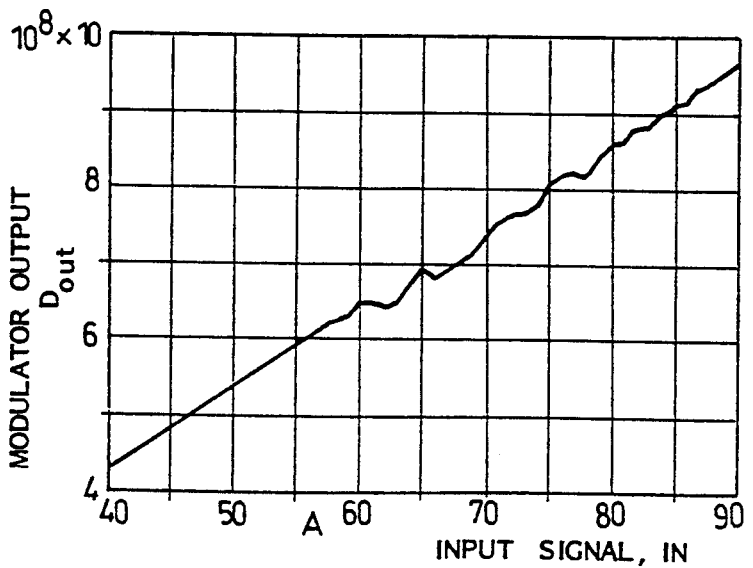

FIG. 7 shows the output Dout of the fifth-order modulator shown in FIG. 4 as a function of the input signal IN. In a stabilization situation the order of the modulator is lowered to three, and the delay of the delay means 44 is three clock cycles. As compared with FIG. 6, the output is dependent on the input signal in a desired manner. In other words, the output of the digital filter obtains values which, though they have a lower resolution, are proportionate to the input signal IN even at input signal values exceeding the point A.

The figures and the description related to them are only intended to illustrate the present invention. In their details, the method and arrangement according to the invention may vary within the scope of the attached claims.

We claim:

1. An arrangement for stabilizing an MF-type high-order sigma-delta modulator comprising at least two integrator stages and a quantizing means to which the output of the last integrator stage is connected, wherein the first, the first two or the first three integrator stages in the high-order modulator form a lower-order modulator which is stable at all input signal values, the arrangement comprising a means for resetting the integrator stages following the lower-order modulator and a coupling means for decoupling the output of one of said series-connected integrator stages from the quantizing means and for coupling the output of said lower-order modulator to the quantizing means when the output voltage of said last integrator stage exceeds a predetermined threshold value corresponding to the upper limit of the stable operation range of the high-order modulator.

2. An arrangement according to claim 1, wherein the coupling means recouples the output of the last integrator stage to the quantizing means with a predetermined delay after the output of the last integrator again falls below said predetermined threshold value.

3. An arrangement according to claim 2, wherein said predetermined delay is at least one clock cycle per each delaying integrator stage following said lower-order modulator.

* * * * *